(12) United States Patent
Lin

(10) Patent No.: US 6,221,734 B1
(45) Date of Patent: Apr. 24, 2001

(54) METHOD OF REDUCING CMP DISHING EFFECT

(75) Inventor: Chingfu Lin, Taipei (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/354,622

(22) Filed: Jul. 15, 1999

(30) Foreign Application Priority Data

May 25, 1999 (TW) ................................................ 88108519

(51) Int. Cl.⁷ ...................................................... H01L 21/76
(52) U.S. Cl. .......................... 438/424; 438/427; 438/435; 438/443; 438/692; 438/700; 438/701; 438/702; 438/792; 438/793; 438/794
(58) Field of Search ..................................... 438/424, 427, 438/435, 443, 692, 700, 701, 702, 792, 793, 794

(56) References Cited

U.S. PATENT DOCUMENTS

| | | | | |
|---|---|---|---|---|
| 4,762,728 | * | 8/1988 | Keyser et al. | 427/38 |
| 5,362,669 | * | 11/1994 | Boyd et al. | 438/437 |
| 5,891,809 | * | 4/1999 | Chau et al. | 438/770 |
| 6,017,803 | * | 1/2000 | Wong | 438/424 |

* cited by examiner

*Primary Examiner*—Jey Tsai
*Assistant Examiner*—Lynne Gurley
(74) *Attorney, Agent, or Firm*—Jiawei Huang; J. C. Patents

(57) ABSTRACT

A method of reducing a chemical mechanical polishing (CMP) dishing effect. A plurality of trenches are formed in the substrate, while a first insulating layer, such as silicon oxide layer is formed on the substrate to fill those trenches. A chemical reaction, such as nitridation reaction, is performed on the surface of the insulating layer to form a second insulating layer, which is harder than the first insulating layer. CMP is then performed.

10 Claims, 1 Drawing Sheet

METHOD OF REDUCING CMP DISHING EFFECT

CROSS-REFERENCE TO RELATED APPLICATION

This application claims the priority benefit of Taiwan application serial no. 88108519, filed May 25, 1999, the full disclosure of which is incorporated herein by reference.

BACKGROUND OF THE INVENTION

1. Field of Invention

The present invention relates to a planarizing method in a semiconductor process. More particularly, the present invention relates to a method of reducing a dishing effect resulting from chemical mechanical polishing (CMP).

2. Description of Related Art

Among the various different semiconductor integrated circuit (IC) processes, surface planarization is one important technique of high-density photolithography treatment, because a planarized surface without height fluctuations can prevent light scattering and help a precise pattern transfer. When the semiconductor process is carried out at the deep sub micron level, CMP is currently the only technique that can provide global planarization for a very large scale integration (VLSI) or ultra large scale integration (ULSI), while also providing a desired planarization in the multilevel interconnect process.

However, there are still problems associated with CMP for a region with a large surface area in the deposition layer. FIG. 1 is a cross-sectional diagram illustrating a CMP dishing effect, which occurs on the substrate surface in the prior art. From the diagram, it is seen that a substrate 10, which is formed with recesses at different surface area (11 and 12), is provided. Consequently, a deposition layer 13 is formed on the substrate 10 to fill the recesses II and 12 with an uneven surface profile. After the surface of the deposition layer 13 is planarized by CMP, a region 14 with over the recess 10 of a large surface area has a lower surface level than the surrounding regions of the deposition layer 13. This is known as a dishing effect.

The occurrence of a CMP dishing effect is mainly due to the fact that a polishing table has a flexible polishing pad. When CMP is performed on the substrate surface with height fluctuations, the polishing pad is located above the substrate surface. Therefore, the polishing pad may deform along the substrate profile when the polishing table applies a downward stress on the polishing pad. The polishing pad may bend more readily downwards to the region with a larger surface area than the surrounding regions, so that this region is polished prior to other regions, causing the dishing effect.

One approach for improving the dishing effect using dummy patterns has been developed. This involves forming several projecting supports in the recess of large surface area to sussequently form a deposition layer having a more even surface profile. As a result, the surface of the deposition layer becomes more planar after being polished without resulting in a dishing effect. The other approach for improving the dishing effect involves filling and planarizing the recess using surfactants with better mobility and flexibility. At the onset of polishing, the surface of the recess is protected. During the polishing step where the height difference of the substrate surface is reduced, the excessive surfactants slowly drip off to yield a uniform substrate surface. However, the two approaches mentioned above either require numerous steps or incur a high cost.

SUMMARY OF THE INVENTION

The invention provides a method of reducing a CMP dishing effect, in which a substrate is provided with a plurality of trenches formed thereon. A first insulating layer, such as a silicon oxide layer, is formed on the substrate to fill those trenches. A chemical reaction, for example, a nitridation reaction is performed on the surface of the first insulating layer to form a second insulating layer, which is harder than the first insulating layer. CMP is then performed.

As embodied and broadly described herein, the stronger second insulating layer is formed to protect the first insulating layer in the recess, so that no dishing effect results from performing CMP on the first insulating layer in the recess.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve explain the principles of the invention. In the drawings.

DESCRIPTION OF THE PREFERRED EMBODIMENTS

Figure 1:
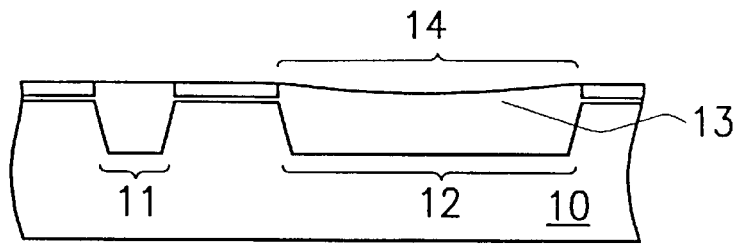
FIG. 1 is a cross-sectional diagram illustrating a CMP dishing effect which occurs on the substrate surface in the prior art.
Figure 2A:
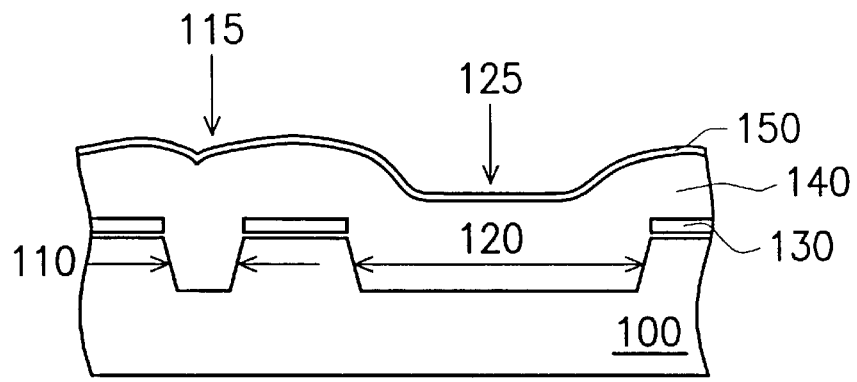
FIGS. 2A to 2C are cross-sectional diagrams illustrating the process flow of a method to reduce the CMP dishing effect according to the preferred embodiment of the present invention.
Figure 2B:
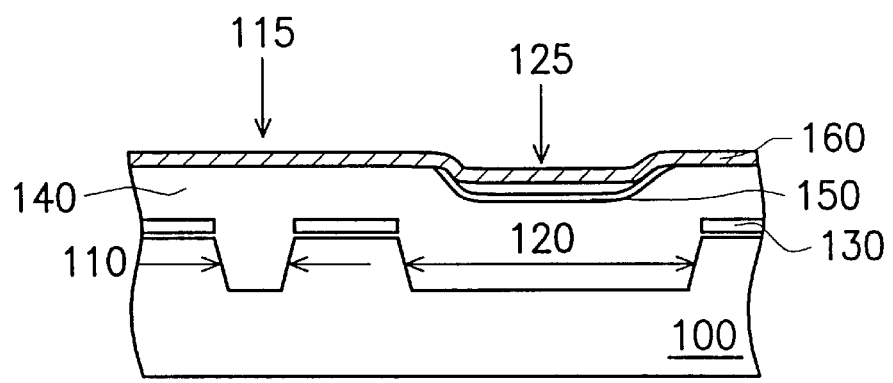
Figure 2C:
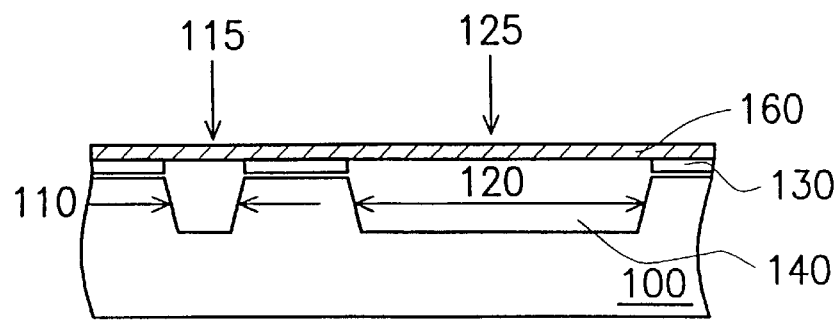

Reference is made to FIGS. 2A to 2C, which illustrate the process flow of a method to reduce the CMP dishing effect according to the preferred embodiment of the present invention. The formation of shallow trench isolation (STI) is used as an example in this case.

In FIG. 2A, a substrate 100 is provided with a masking layer 130, such as a silicon nitride layer, formed thereon. Trenches 110, 120 are formed in the substrate 100, wherein the trench 120 is wider than the trench 110. A first insulating layer 140, such as a silicon oxide layer is then formed to fill the trenches 110, 120 and to cover the masking layer 130. As the trench 120 is wider than the trench 110, the first insulating layer 140 at location 125 above the trench 120 is lower than the other regions, including location 115 above the trench 110.

A chemical reaction is performed on the surface of the first insulating layer 140 to form a second insulating layer 150 with greater hardness. When the material for the first insulating layer 140 is silicon oxide, the chemical reaction may involve a nitridation reaction. The nitridation reaction is performed using a nitridation agent selected from a group comprising of $NH_3$, $N_2/H_2$, $N_2$, NO, $N_2O$, and their combination with a flow rate of about 10–5000 sccm, and a temperature at about 0–1100° C. Alternatively, the nitridation reaction is performed with the above gases or their combination in plasma generated by an electrical power of about 300–4000 W. As a result, a second insulating layer 150 with greater hardness is formed on the silicon oxide surface.

Referring to FIG. 2B, CMP is performed to polish downwards with a polishing pad located above the substrate 100.

As the first insulating layer 140 at location 115 is higher than that at location 125, the first insulating layer 140 at the higher region is subjected to greater stress and thus is polished first. On the other hand, since the first insulating layer 140 at a location 125 is lower in height, it has at most traces of surface damages even though the polishing pad 160 in this region bends slightly downwards and has some contact with the second insulating layer 150.

Referring to FIG. 2C, the CMP is performed again. As the second insulating layer 150 above the first insulating layer 140 at the location 115 is initially removed, the first insulating layer 140 at location 115 is polished earlier. The second insulating layer 150 above the first insulating layer 140 at the location 125 is then removed, so that the first insulating layer 140 at location 125 is removed later. Since the first insulating layer 140 at location 115 is removed earlier than at location 125, there is no height difference between the location 125 and the location 115 when the masking layer 130 acting as a polishing stop is exposed. This solves the problem of the dishing effect, which would usually occur at location 125 as a result of CMP.

It is understood from the above embodiment that the harder second insulating layer is formed to protect the first insulating layer at lower level. It is known that during CMP, a polishing table applies a downward stress to a polishing pad to bend the polishing pad. As a consequence, while polishing a soft material, a deformation such as a dishing is easily caused. By forming a harder second insulating layer on top of the softer first insulating layer, the downward stress is resisted to prevent such a deformation. As a result, this increases the polishing time lag for the first insulating layer at different levels, so that no dishing effect results from CMP on the first insulating layer in the recess; a planar surface is thus obtained.

Although the above embodiment uses a STI formation as an example, it should not be limited hereto. It is also applicable to the planarizing process for the insulating layer of the multilevel interconnects.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of reducing a chemical mechanical polishing (CMP) dishing effect, the method being applicable to a substrate with a plurality of trenches, formed therein, the method comprising:

forming a masking layer on the substrate that serves as a polishing stop;

forming a silicon oxide layer on the substrate and the trenches;

performing a nitridation reaction on a surface of the silicon oxide to form a silicon nitride layer on the silicon oxide layer; and performing CMP on the silicon nitride layer and the silicon oxide layer.

2. The method of claim 1, wherein the nitridation reaction uses a nitridation agent selected from a group consisting of $NH_3$, $N_2/H_2$, $N_2$, NO, and $N_2O$.

3. The method of claim 2, wherein the nitridation agent has a flow rate of about 10–5000 sccm.

4. The method of claim 1, wherein the nitridation reaction uses a plasma containing nitride for treating the surface of the silicon oxide layer.

5. The method of claim 4, wherein a power supply for the plasma containing nitride is about 400–3000 W.

6. The method of claim 1, wherein a temperature for performing the nitridation reaction is about 0–1100° C.

7. A planarizing method for a semiconductor device which has an uneven surface profile, the method comprising:

forming a masking layer on a substrate that serves as a polishing stop;

forming an insulating layer over the substrate;

performing a chemical reaction on a surface of the insulating layer to harden the surface of the insulating layer; and performing a CMP step, wherein the hardened surface of the insulating layer can resist a downward stress applied by a polishing table, so that the insulating layer is polished without dishing.

8. The method of claim 7, wherein the chemical reaction includes a nitridation reaction.

9. The method of claim 8, wherein the nitridation reaction uses a nitridation agent selected from a group consisting of $NH_3$, $N_2/H_2$, $N_2$, NO, and $N_2O$.

10. The method of claim 8, wherein the nitridation reaction uses a plasma containing nitride for treating the surface of the first insulating layer.

* * * * *